(12) United States Patent
Discekici et al.

(10) Patent No.: US 12,146,066 B2
(45) Date of Patent: Nov. 19, 2024

(54) THREE-DIMENSIONAL PRINTING WITH DIRECTIONALLY-DEPENDENT REFLECTIVE PARTICLES

(71) Applicant: Hewlett-Packard Development Company, L.P., Spring, TX (US)

(72) Inventors: Emre Hiro Discekici, San Diego, CA (US); Shannon Reuben Woodruff, San Diego, CA (US); Alay Yemane, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 32 days.

(21) Appl. No.: 17/297,073

(22) PCT Filed: Aug. 9, 2019

(86) PCT No.: PCT/US2019/045845
§ 371 (c)(1),
(2) Date: May 26, 2021

(87) PCT Pub. No.: WO2021/029850
PCT Pub. Date: Feb. 18, 2021

(65) Prior Publication Data
US 2022/0154023 A1 May 19, 2022

(51) Int. Cl.
*B33Y 10/00* (2015.01)
*B29B 7/90* (2006.01)
(Continued)

(52) U.S. Cl.
CPC ........... *C09D 11/34* (2013.01); *B29B 7/90* (2013.01); *B29C 64/165* (2017.08);
(Continued)

(58) Field of Classification Search
CPC ..... B29C 64/165; B29C 64/314; H01L 33/60; B29B 7/90; B29K 2505/00; B33Y 70/00
See application file for complete search history.

(56) References Cited

U.S. PATENT DOCUMENTS 9,135,374 B2 * 9/2015 Jones ................. G06F 30/00
9,849,713 B2   12/2017 Schmid et al.
(Continued)

FOREIGN PATENT DOCUMENTS

CN    100567023 C    12/2009
CN    102643505 A    8/2012
(Continued)

*Primary Examiner* — Nahida Sultana
(74) *Attorney, Agent, or Firm* — Dierker & Kavanaugh, P.C.

(57) ABSTRACT

This disclosure describes three-dimensional printing kits, methods, and systems for three-dimensional printing with directionally-dependent reflective particles. In one example, a three-dimensional printing kit can include a powder bed material and a fusing agent to selectively apply to the powder bed material. The powder bed material can include polymer particles and directionally-dependent reflective particles. The directionally-dependent reflective particles can be chemically and thermally stable at a melting point temperature of the polymer particles. The fusing agent can include water and a radiation absorber to absorb radiation energy and convert the radiation energy to heat.

13 Claims, 4 Drawing Sheets

(51) Int. Cl.
B29C 64/165 (2017.01)
B29C 64/314 (2017.01)
B33Y 30/00 (2015.01)
B33Y 40/10 (2020.01)
B33Y 70/10 (2020.01)
C09D 11/037 (2014.01)
C09D 11/102 (2014.01)
C09D 11/322 (2014.01)
C09D 11/34 (2014.01)
B29K 467/00 (2006.01)
B29K 505/00 (2006.01)

(52) U.S. Cl.
CPC ............ B29C 64/314 (2017.08); B33Y 10/00 (2014.12); B33Y 30/00 (2014.12); B33Y 40/10 (2020.01); B33Y 70/10 (2020.01); C09D 11/037 (2013.01); C09D 11/102 (2013.01); C09D 11/322 (2013.01); B29K 2467/003 (2013.01); B29K 2505/00 (2013.01); B29K 2995/003 (2013.01)

(56) References Cited

U.S. PATENT DOCUMENTS

| | | | |
|---|---|---|---|
| 2014/0255666 A1* | 9/2014 | Stucker | B29C 64/165 264/401 |
| 2019/0030788 A1* | 1/2019 | Erickson | B29C 67/00 |
| 2019/0047216 A1 | 2/2019 | Emamjomeh et al. | |
| 2019/0345644 A1* | 11/2019 | Ramakrishnan | B33Y 70/00 |
| 2020/0298475 A1* | 9/2020 | Myerberg | B33Y 70/10 |
| 2021/0260652 A1* | 8/2021 | Bose | B33Y 10/00 |

FOREIGN PATENT DOCUMENTS

| | | | | |
|---|---|---|---|---|
| CN | 104193919 A | 12/2014 | | |
| CN | 104629245 A | 5/2015 | | |
| CN | 105524399 A | 4/2016 | | |
| CN | 106633723 A | 5/2017 | | |
| WO | WO-2017077137 A2 * | 5/2017 | | B22F 1/00 |
| WO | WO-2017161120 A1 | 9/2017 | | |

* cited by examiner

THREE-DIMENSIONAL PRINTING WITH DIRECTIONALLY-DEPENDENT REFLECTIVE PARTICLES

BACKGROUND

Methods of three-dimensional (3D) digital printing, a type of additive manufacturing, have continued to be developed over the last few decades. However, systems for 3D printing have historically been very expensive, though those expenses have been coming down to more affordable levels recently. In general, 3D printing technology can shorten the product development cycle by allowing rapid creation of prototype models for reviewing and testing. Unfortunately, the concept has been somewhat limited with respect to commercial production capabilities because the range of materials used in 3D printing is likewise limited. Accordingly, it can be difficult to 3D print functional parts with desired properties such as mechanical strength, visual appearance, and so on. Nevertheless, several commercial sectors such as aviation and the medical industry have benefitted from the ability to rapidly prototype and customize parts for customers.

DETAILED DESCRIPTION

Figure 1:
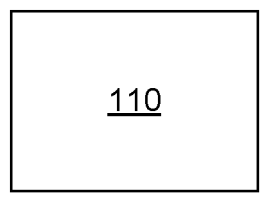
FIG. 1 is a schematic view of an example three-dimensional printing kit in accordance with examples of the present disclosure.
Figure 1:
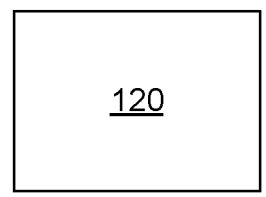

The present disclosure describes three-dimensional printing kits, methods, and systems that can be used for three-dimensional printing with directionally-dependent reflective particles. In one example, a three-dimensional printing kit can include a powder bed material and a fusing agent to selectively apply to the powder bed material. The powder bed material can include polymer particles and directionally-dependent reflective particles. The directionally-dependent reflective particles can be chemically and thermally stable at a melting point temperature of the polymer particles. The fusing agent can include water and a radiation absorber to absorb radiation energy and convert the radiation energy to heat.

In one example, the directionally-dependent reflective particles can be polyethylene terephthalate (PET) particles having a reflective coating. In another example, the directionally-dependent reflective particles can be metal particles without a reflective coating. In yet another example, the directionally-dependent reflective particles can have a reflective coating with a melting point temperature from about 10° C. to about 100° C. greater than the melting point temperature of the polymer particles. In a further example, the directionally-dependent reflective particles can have an X dimension length, a Y dimension width, and a Z dimension thickness, wherein the X dimension length is from about 200 μm to about 2 mm, the Y dimension width is from about 200 μm to about 2 mm, and the Z dimension thickness is no more than 10% of both the X dimension length and the Y dimension width. In yet a further example, the polymer particles can be present in the powder bed material at an amount from about 60 wt % to about 99 wt % based on the total weight of the powder bed material. In one aspect, the directionally-dependent reflective particles can be present in the powder bed material at an amount from about 0.05 wt % to about 30 wt % based on the total weight of the powder bed material. In another aspect, the melting point temperature of the polymer particles can be from about 70° C. to about 350° C. In yet another aspect, the radiation absorber can be a metal dithiolene complex, carbon black, a near-infrared absorbing dye, a near-infrared absorbing pigment, metal nanoparticles, a conjugated polymer, or a combination thereof. In a further example, the polymer particles can comprise polyamide 6, polyamide 9, polyamide 11, multipurpose polyamide 12 (MP PA-12), polyamide 66, polyamide 612, thermoplastic polyamide (TPA), polyamide copolymer, polyethylene, thermoplastic polyurethane, polypropylene, polyester, polycarbonate, polyether ketone, polyacrylate, polystyrene, wax, or a combination thereof. In yet a further example, the three-dimensional printing kit can also include a detailing agent that includes a detailing compound, wherein the detailing compound reduces the temperature of powder bed material onto which the detailing agent is applied.

The present disclosure also describes methods of making three-dimensional printed articles. In one examples, a method of making a three-dimensional printed article can include iteratively applying individual layers of a powder bed material to a powder bed. The powder bed material can include polymer particles and directionally-dependent reflective particles, wherein the directionally-dependent reflective particles can be chemically and thermally stable at a melting point temperature of the polymer particles. A fusing agent can be selectively applied onto the individual layers of powder bed material based on a three-dimensional object model. The fusing agent can include water and a radiation absorber, wherein the radiation absorber absorbs radiation energy and converts the radiation energy to heat. The powder bed can be exposed to radiation energy to selectively fuse the polymer particles in contact with the radiation absorber at individual layers and thereby form the three-dimensional printed article. In a further example, the method can also include forming the powder bed material by mixing the directionally-dependent reflective particles with the polymer particles.

The present disclosure also describes systems for three-dimensional printing. In one example, a system for three-dimensional printing can include a powder bed material, a fusing agent to be applied onto a layer of powder bed material, and a radiant energy source positioned to expose the layer of powder bed material to radiation. The powder bed material can include polymer particles and directionally-dependent reflective particles, wherein the directionally-dependent reflective particles can be chemically and thermally stable at a melting point temperature of the polymer particles. The fusing agent can include water and a radiation absorber, wherein the radiation absorber absorbs radiation energy and converts the radiation energy to heat. The radiation from the radiant energy source can selectively fuse the polymer particles in contact with the radiation absorber and thereby form a three-dimensional printed article. In one example, the polymer particles can be present in the powder bed material in an amount from about 60 wt % to about 99.95 wt % based on the total weight of the powder bed material. In another example, the directionally-dependent reflective particles can be present in the powder bed material in an amount from about 0.05 wt % to about 40 wt % based on the total weight of the powder bed material.

The three-dimensional printing kits, methods, and systems described herein can be used to make three-dimensional (3D) printed articles having enhanced aesthetic or cosmetic properties, such as light reflectance properties, which can cause the 3D printed articles to be shiny, shimmery, glittery, sparkly, iridescent, etc. This can be useful for different types of 3D printed articles in which a characteristic light reflectance is desired. For example, 3D printed wearables, mobile device cases, ornamental/decorative parts, etc. can have light reflectance properties to enhance their aesthetic or cosmetic properties. In other words, it can be desired to impart a characteristic light reflectance to a 3D printed article for aesthetic or cosmetic appeal and to provide a particular end-user experience. Accordingly, 3D printed articles can be made with light reflectance properties using the materials and methods described herein.

As mentioned above, directionally-dependent reflective particles can be included in the powder bed material used in the 3D printing process. The 3D printing processes described herein generally include applying a fusing agent to a powder bed material that includes polymer particles and the directionally-dependent reflective particles. The fusing agent can include a radiation absorber, which can be a compound or material that absorbs radiation energy (such as UV or infrared radiation) and converts the energy to heat. After applying the fusing agent, and radiation source is used to irradiate the powder bed. The areas of the powder bed where the fusing agent was applied can be selectively heated to a melting or softening point temperature of the polymer particles so that the polymer particles fuse together to form a solid layer of the final 3D printed article.

In some examples, the directionally-dependent reflective particles can be added to the powder bed material in a sufficient amount to provide a reflectance without significantly affecting the other properties of the 3D printed articles. For example, the directionally-dependent reflective particles can provide a desired reflectance without negatively impacting the appearance of the 3D printed article or the physical properties of the 3D printed article. Furthermore, the directionally-dependent reflective particles can be added to the powder bed material and the powder bed material can be used in the 3D printing process without changing the parameters of the printing process. In other words, the 3D printing process can be performed using the same temperatures, speeds, amounts of fluid agents, etc., as when the 3D printing process is performed without the directionally-dependent reflective particles. However, in some cases the parameters of the 3D printing process may be adjusted to accommodate the directionally-dependent reflective particles, for example to avoid destroying directionally-dependent reflective particles with a low decomposition temperature. Generally, the directionally-dependent reflective particles can be chemically and thermally stable at the melting point of the polymer particles in the powder bed material so that the polymer particles can be fused together without damaging the directionally-dependent reflective particles.

Three-Dimensional Printing Kits

With this description in mind, the present disclosure describes three-dimensional printing kits that include materials for 3D printing directionally-dependent reflecting articles. These three-dimensional printing kits can include a powder bed build material including polymer particles and directionally-dependent reflective particles and a fusing agent that includes a radiation absorber to absorb radiation energy and convert the radiation energy to heat. The directionally-dependent reflective particles can be chemically and thermally stable at a melting point temperature of the polymer particles.

FIG. 1 is a schematic of one example three-dimensional printing kit 100. This three-dimensional printing kit includes a powder bed material 110 and a fusing agent 120. The powder bed material can include polymer particles and directionally-dependent reflective particles that are chemically and thermally stable at a melting point temperature of the polymer particles. The fusing agent can be selectively applied to the powder bed material. The fusing agent can include water and a radiation absorber. The radiation absorber can absorb radiation energy and convert the radiation energy to heat.

As used herein, "chemically stable" and "thermally stable" can be used with reference to the directionally-dependent reflective particles to describe directionally-dependent reflective particles that do not chemically or physically decompose or react to form different chemical compounds when heated to the melting point temperature of the polymer powder; or if the directionally-dependent reflective particles begin to decompose or react at the melting point temperature, the decomposition or reaction can be sufficiently slow that less than 10 wt % of the directionally-dependent reflective particles decompose or react while the polymer particles are being fused together. Thus, in either case, they retain directionally-dependent reflective properties.

As used herein, "directionally-dependent reflective particles" can be used with reference to particles that reflect light in specific directions relative to any light sources that may be present, similar to a mirror-like reflection. Such particles can produce an effect to a viewer of the particles having a appearance that is shiny, shimmery, glittery, sparkly, or iridescent, for example. Thus, the term "directionally dependent" indicates that the effect produced as viewed by individual changes as the angle of viewing and/or the angle of the light source is changed relative to a flattened surface of the particles. In other words, the reflection can be "directionally-dependent" since a reflection can be based on a direction of light introduced or the angle from which the particle is viewed relative to various light input sources that may be present. Directionally dependent reflective particles are not particles that are diffusive of the light, scattering light upon reflection. Further, the reflection can be specular, and a mirror-like reflection of light can occur from a surface of the directionally-dependent reflective particles.

Figure 2:
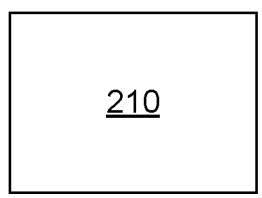
FIG. 2 is a schematic view of another example three-dimensional printing kit in accordance with examples of the present disclosure.
Figure 2:
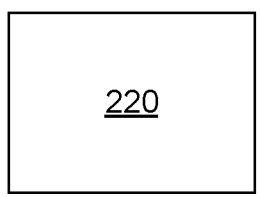
Figure 2:
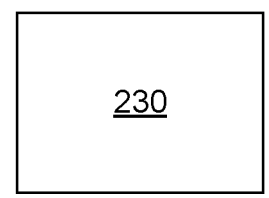

Another example is shown in FIG. 2. This figure shows an example three-dimensional printing kit 200 that includes a powder bed material 210, a fusing agent 220, and a detailing agent 230. The fusing agent and the detailing agent can be selectively applied to the powder bed material. The powder bed material and the fusing agent can include the same ingredients as in the example of FIG. 1. The detailing agent can include a detailing compound that reduces the temperature of powder bed material onto which the detailing agent is applied.

Figure 3A:
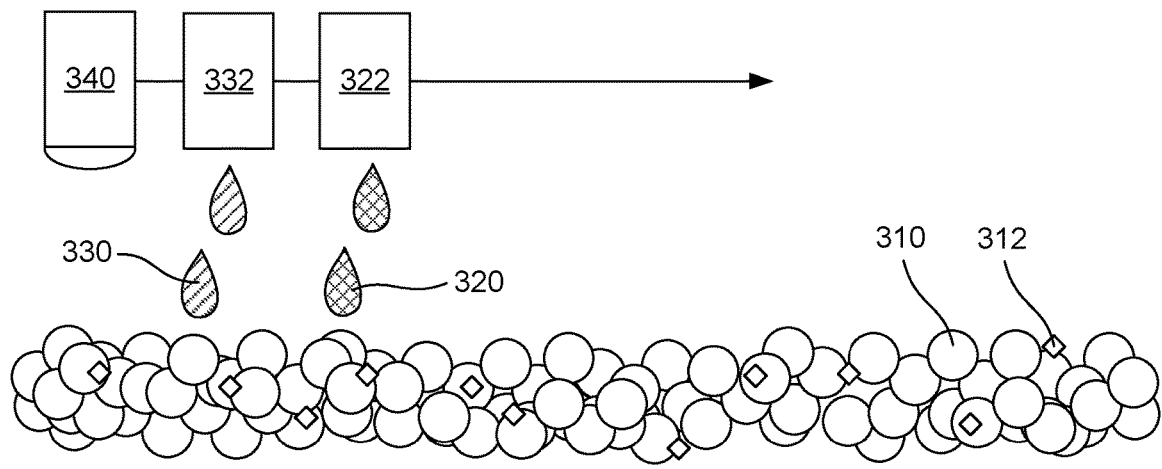
FIGS. 3A-3C show a schematic view of an example three-dimensional printing process using an example three-dimensional printing kit in accordance with examples of the present disclosure.
Figure 3B:
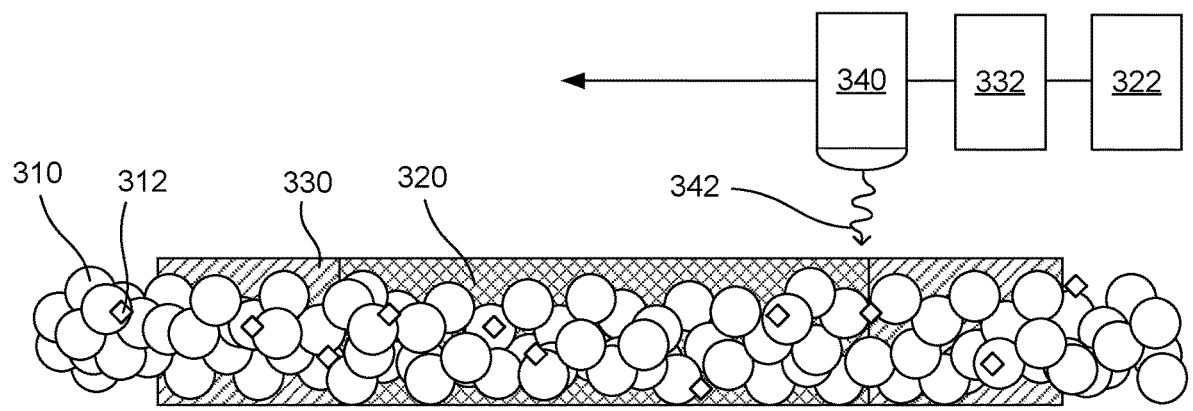
Figure 3C:
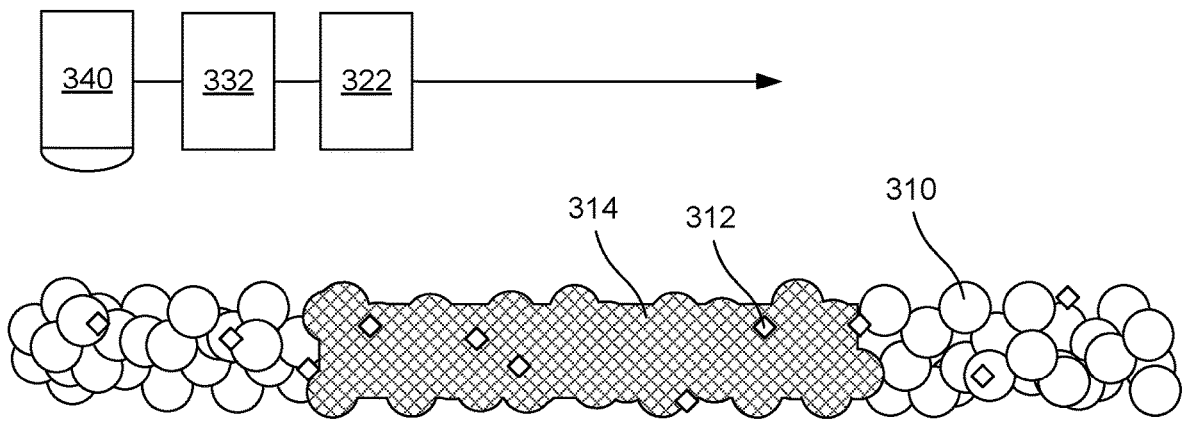

FIGS. 3A-3C illustrate one example of using the three-dimensional printing kits to form a 3D printed article. In FIG. 3A, a fusing agent 320 and a detailing agent 330 are jetted onto a layer of powder bed material made up of polymer particles 310 and directionally-dependent reflective particles 312 mixed with the polymer particles. The fusing agent is jetted from a fusing agent ejector 322 and the detailing agent is jetted from a detailing agent ejector 332. These fluid ejectors can move across the layer of powder bed material to selectively jet fusing agent on areas that are to be fused, while the detailing agent can be jetted onto areas that are to be cooled. In some cases, the detailing agent can be jetted around edges of the area where the fusing agent was jetted to prevent the surrounding powder bed material from caking. In other examples, the detailing agent can be jetted onto a portion of the same area where the fusing agent was jetted to prevent overheating of the powder bed material. A radiation source 340 can also move across the layer of powder bed material.

FIG. 3B shows the layer of powder bed material after the fusing agent 320 has been jetted onto an area of the layer that is to be fused. Additionally, the detailing agent 330 has been jetted onto areas of the powder bed adjacent to edges of the area where the fusing agent was jetted. In this figure, the radiation source 340 is shown emitting radiation 342 toward the layer of polymer particles 310 and directionally-dependent reflective particles 312. The fusing agent can include a radiation absorber that can absorb this radiation and convert the radiation energy to heat.

FIG. 3C shows the layer of powder bed material with a fused portion 314 where the fusing agent was jetted. This portion has reached a sufficient temperature to fuse the polymer particles together to form a solid polymer matrix. The fused portion has directionally-dependent reflective particles 312 trapped within which can impart a directionally-dependent reflectance to the final 3D printed article. The area where the detailing agent was jetted remains as loose powder. In this example, the detailing agent evaporates to evaporatively cool the polymer particles, which can help produce a well-defined edge of the fused layer by reducing partially fused or caked powder particles around the edges.

Powder Bed Material

The powder bed material can include polymer particles and directionally-dependent reflective particles. In certain examples, the powder bed material can include polymer particles having a variety of shapes, such as substantially spherical particles or irregularly-shaped particles. In some examples, the polymer powder can be capable of being formed into 3D printed objects with a resolution of about 20 μm to about 100 μm, about 30 μm to about 90 μm, or about 40 μm to about 80 μm. As used herein, "resolution" refers to the size of the smallest feature that can be formed on a 3D printed object. The polymer powder can form layers from about 20 μm to about 100 μm thick, allowing the fused layers of the printed part to have roughly the same thickness. This can provide a resolution in the z-axis (i.e., depth) direction of about 20 μm to about 100 μm. The polymer powder can also have a sufficiently small particle size and sufficiently regular particle shape to provide about 20 μm to about 100 μm resolution along the x-axis and y-axis (i.e., the axes parallel to the top surface of the powder bed). For example, the polymer powder can have an average particle size from about 20 μm to about 100 μm. In other examples, the average particle size can be from about 20 μm to about 50 μm. Other resolutions along these axes can be from about 30 μm to about 90 μm or from about 40 μm to about 80 μm.

The polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be polyamide 6 powder, polyamide 9 powder, polyamide 11 powder, polyamide 12 powder, polyamide 6,6 powder, polyamide 6,12 powder, thermoplastic polyamide powder, polyamide copolymer powder, polyethylene powder, wax, thermoplastic polyurethane powder, acrylonitrile butadiene styrene powder, amorphous polyamide powder, polymethylmethacrylate powder, ethylene-vinyl acetate powder, polyarylate powder, silicone rubber, polypropylene powder, polyester powder, polycarbonate powder, copolymers of polycarbonate with acrylonitrile butadiene styrene, copolymers of polycarbonate with polyethylene terephthalate polyether ketone powder, polyacrylate powder, polystyrene powder, or mixtures thereof. In a specific example, the polymer powder can be polyamide 12, which can have a melting point from about 175° C. to about 200° C. In another specific example, the polymer powder can be a polyamide copolymer.

The directionally-dependent reflective particles used in the powder bed material can generally be any particle having lighting reflecting properties that is sufficiently stable to undergo the conditions of the 3D printing processes described herein. For example, the directionally-dependent reflective particles can be chemically and thermally stable at the melting point temperature of the polymer particles. Therefore, when the polymer particles are heated and fused together during 3D printing, the directionally-dependent reflective particles can retain their reflectance so that the final 3D printed article can have the desired reflectance.

In one example, the directionally-dependent reflective particles can be composed of a thermoplastic polymer, coloring and a reflective coating, such as aluminum, titanium dioxide, iron oxide, bismuth oxychloride, etc. For example, flat multi-layered sheets can be produced that combine the thermoplastic polymer, the coloring and the reflective coating. These sheets can be cut into small particles of various shapes including squares, triangles, rectangles, hexagons, etc. to produce the directionally-dependent reflective particles. The reflective coating can cause light to be reflected at different angles, thereby causing a surface of the directionally-dependent reflective particles to sparkle or shimmer.

In one example, the directionally-dependent reflective particles can be glitter-like polyethylene terephthalate (PET) particles having the reflective coating. In another example, the directionally-dependent reflective particles can be metals without a reflective coating, as the metals can naturally reflect light with an increased amount of reflectivity. For example, the directionally-dependent reflective particles can be made from aluminum, gold, silver, copper, etc. In another example, the directionally-dependent reflective particles can be made from natural mica, synthetic mica, malachite, hematite, galena, glass or other suitable materials that reflect light and produce a sparkly or shimmery effect.

In one example, the directionally-dependent reflective particles can have an X dimension length, a Y dimension width, and a Z dimension thickness, where X, Y and Z are positive integers. The X dimension length can be from about 200 μm to about 2 mm, the Y dimension width can be from about 200 μm to about 2 mm, and the Z dimension thickness can be no more than 10% of both the X dimension length and the Y dimension width. In other words, the reduced Z dimension thickness can cause the directionally-dependent reflective particles to be relatively flat, which can produce the sparkly or shimmery effect In one example, the polymer particles can be from about 20 μm to about 150 μm. Therefore, in one example, the directionally-dependent reflective particles can have a size that is greater than that of the polymer particles, which can cause the directionally-dependent reflective particles to appear more prominent on a 3D printed article. As a result, the aesthetic properties of the directionally-dependent reflective particles can be enhanced.

As explained above, the directionally-dependent reflective particles can be chemically and thermally stable at the melting point temperature of the polymer particles. In some examples, the directionally-dependent reflective particles can be a solid at room temperature, and a reflective coating of the directionally-dependent reflective particles can have a melting point temperature that is greater than the melting point temperature of the polymer particles. For example, the melting point temperature of the reflective coating of the directionally-dependent reflective particles can be from about 10° C. to about 100° C. greater than the melting point temperature of the polymer particles.

In various examples, the amount of directionally-dependent reflective particles added to the powder bed material can be selected to provide an appropriate strength of the light reflectance without interfering with the 3D printing process or the properties of the final 3D printed article. In some examples, the directionally-dependent reflective particles can be present in an amount from about 0.05 wt % to about 30 wt % based on the total weight of the powder bed material. In addition, the polymer particles can be present in the powder bed material at an amount from about 60 wt % to about 99 wt % based on the total weight of the powder bed material.

The directionally-dependent reflective particles can be incorporated into the powder bed material by mixing the directionally-dependent reflective particles with polymer particles. In some examples, the directionally-dependent reflective particles can be a solid powder and the directionally-dependent reflective particles can be dry blended with the polymer particles, such that the directionally-dependent reflective particles can be uniformly incorporated into the polymer particles. In other examples, the directionally-dependent reflective particles can be in the form of a solution and the solution can be blended with the polymer particles. The mixture can then be dried to produce a dry powder bed material. In further examples, the directionally-dependent reflective particles can be a liquid that is blended with the polymer particles. The liquid directionally-dependent reflective particles can be mixed with the polymer particles in a sufficiently small amount that the powder bed material is still flowable similar to a dry powder. In still further examples, the directionally-dependent reflective particles can be incorporated into the polymer particles at the time of manufacturing the polymer particles. The directionally-dependent reflective particles can be added during the polymerization process or mixed into a molten polymer before the polymer is formed into particles, in various examples.

The powder bed material can also in some cases include a filler. The filler can include inorganic particles such as alumina, silica, fibers, carbon nanotubes, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from about 100:1 to about 1:2 or from about 5:1 to about 1:1.

Fusing Agents

The multi-fluid kits and three-dimensional printing kits described herein can include a fusing agent to be applied to the powder bed build material. The fusing agent can include a radiation absorber that can absorb radiant energy and convert the energy to heat. In certain examples, the fusing agent can be used with a powder bed material in a particular 3D printing process. A thin layer of powder bed material can be formed, and then the fusing agent can be selectively applied to areas of the powder bed material that are desired to be consolidated to become part of the solid 3D printed object. The fusing agent can be applied, for example, by printing such as with a fluid ejector or fluid jet printhead. Fluid jet printheads can jet the fusing agent in a similar way to an inkjet printhead jetting ink. Accordingly, the fusing agent can be applied with great precision to certain areas of the powder bed material that are desired to form a layer of the final 3D printed object. After applying the fusing agent, the powder bed material can be irradiated with radiant energy. The radiation absorber from the fusing agent can absorb this energy and convert it to heat, thereby heating any polymer particles in contact with the radiation absorber. An appropriate amount of radiant energy can be applied so that the area of the powder bed material that was printed with the fusing agent heats up enough to melt the polymer particles to consolidate the particles into a solid layer, while the powder bed material that was not printed with the fusing agent remains as a loose powder with separate particles.

In some examples, the amount of radiant energy applied, the amount of fusing agent applied to the powder bed, the concentration of radiation absorber in the fusing agent, and the preheating temperature of the powder bed (i.e., the temperature of the powder bed material prior to printing the fusing agent and irradiating) can be tuned to ensure that the portions of the powder bed printed with the fusing agent will be fused to form a solid layer and the unprinted portions of the powder bed will remain a loose powder. These variables can be referred to as parts of the "print mode" of the 3D printing system. Generally, the print mode can include any variables or parameters that can be controlled during 3D printing to affect the outcome of the 3D printing process.

Generally, the process of forming a single layer by applying fusing agent and irradiating the powder bed can be repeated with additional layers of fresh powder bed material to form additional layers of the 3D printed article, thereby building up the final object one layer at a time. In this process, the powder bed material surrounding the 3D printed article can act as a support material for the object. When the 3D printing is complete, the article can be removed from the powder bed and any loose powder on the article can be removed.

Accordingly, in some examples, the fusing agent can include a radiation absorber that is capable of absorbing electromagnetic radiation to produce heat. The radiation absorber can be colored or colorless. In various examples, the radiation absorber can be a pigment such as carbon black pigment, glass fiber, titanium dioxide, clay, mica, talc, barium sulfate, calcium carbonate, a near-infrared absorbing dye, a near-infrared absorbing pigment, a conjugated polymer, a dispersant, or combinations thereof. Examples of near-infrared absorbing dyes include aminium dyes, tetraaryldiamine dyes, cyanine dyes, pthalocyanine dyes, dithiolene dyes, and others. In further examples, radiation absorber can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the radiation absorber can have a peak absorption wavelength in the range of about 800 nm to about 1400 nm.

A variety of near-infrared pigments can also be used. Non-limiting examples can include phosphates having a variety of counterions such as copper, zinc, iron, magnesium, calcium, strontium, the like, and combinations thereof. Non-limiting specific examples of phosphates can include $M_2P_2O_7$, $M_4P_2O_9$, $M_5P_2O_{10}$, $M_3(PO_4)_2$, $M(PO_3)_2$, $M_2P_4O_{12}$, and combinations thereof, where M represents a counterion having an oxidation state of +2, such as those listed above or a combination thereof. For example, $M_2P_2O_7$ can include compounds such as $Cu_2P_2O_7$, $Cu/MgP_2O_7$, $Cu/ZnP_2O_7$, or any other suitable combination of counterions. It is noted that the phosphates described herein are not limited to counterions having a +2 oxidation state. Other phosphate counterions can also be used to prepare other suitable near-infrared pigments.

Additional near-infrared pigments can include silicates. Silicates can have the same or similar counterions as phosphates. One non-limiting example can include $M_2SiO_4$, $M_2Si_2O_6$, and other silicates where M is a counterion having an oxidation state of +2. For example, the silicate $M_2Si_2O_6$ can include $Mg_2Si_2O_6$, $Mg/CaSi_2O_6$, $MgCuSi_2O_6$, $Cu_2Si_2O_6$, $Cu/ZnSi_2O_6$, or other suitable combination of counterions. It is noted that the silicates described herein are not limited to counterions having a +2 oxidation state. Other silicate counterions can also be used to prepare other suitable near-infrared pigments.

In further examples, the radiation absorber can include a metal dithiolene complex. Transition metal dithiolene complexes can exhibit a strong absorption band in the 600 nm to 1600 nm region of the electromagnetic spectrum. In some examples, the central metal atom can be any metal that can form square planar complexes. Non-limiting specific examples include complexes based on nickel, palladium, and platinum.

A dispersant can be included in the fusing agent in some examples. Dispersants can help disperse the radiation absorbing pigments described above. In some examples, the dispersant itself can also absorb radiation. Non-limiting examples of dispersants that can be included as a radiation absorber, either alone or together with a pigment, can include polyoxyethylene glycol octylphenol ethers, ethoxylated aliphatic alcohols, carboxylic esters, polyethylene glycol ester, anhydrosorbitol ester, carboxylic amide, polyoxyethylene fatty acid amide, poly (ethylene glycol) p-isooctylphenyl ether, sodium polyacrylate, and combinations thereof.

The amount of radiation absorber in the fusing agent can vary depending on the type of radiation absorber. In some examples, the concentration of radiation absorber in the fusing agent can be from about 0.1 wt % to about 20 wt %. In one example, the concentration of radiation absorber in the fusing agent can be from about 0.1 wt % to about 15 wt %. In another example, the concentration can be from about 0.1 wt % to about 8 wt %. In yet another example, the concentration can be from about 0.5 wt % to about 2 wt %. In a particular example, the concentration can be from about 0.5 wt % to about 1.2 wt %. In one example, the radiation absorber can have a concentration in the fusing agent such that after the fusing agent is jetted onto the polymer powder, the amount of radiation absorber in the polymer powder can be from about 0.0003 wt % to about 10 wt %, or from about 0.005 wt % to about 5 wt %, with respect to the weight of the polymer powder.

In some examples, the fusing agent can be jetted onto the polymer powder build material using a fluid jetting device, such as inkjet printing architecture. Accordingly, in some examples, the fusing agent can be formulated to give the fusing agent good jetting performance. Ingredients that can be included in the fusing agent to provide good jetting performance can include a liquid vehicle. Thermal jetting can function by heating the fusing agent to form a vapor bubble that displaces fluid around the bubble, and thereby forces a droplet of fluid out of a jet nozzle. Thus, in some examples the liquid vehicle can include a sufficient amount of an evaporating liquid that can form vapor bubbles when heated. The evaporating liquid can be a solvent such as water, an alcohol, an ether, or a combination thereof.

In some examples, the liquid vehicle formulation can include a co-solvent or co-solvents present in total at from about 1 wt % to about 50 wt %, depending on the jetting architecture. Further, a non-ionic, cationic, and/or anionic surfactant can be present, ranging from about 0.01 wt % to about 5 wt %. In one example, the surfactant can be present in an amount from about 1 wt % to about 5 wt %. The liquid vehicle can include dispersants in an amount from about 0.5 wt % to about 3 wt %. The balance of the formulation can be purified water, and/or other vehicle components such as biocides, viscosity modifiers, materials for pH adjustment, sequestering agents, preservatives, and the like. In one example, the liquid vehicle can be predominantly water.

In some examples, a water-dispersible or water-soluble radiation absorber can be used with an aqueous vehicle. Because the radiation absorber is dispersible or soluble in water, an organic co-solvent may not be present, as it may not be included to solubilize the radiation absorber. Therefore, in some examples the fluids can be substantially free of organic solvent, e.g., predominantly water. However, in other examples a co-solvent can be used to help disperse other dyes or pigments, or enhance the jetting properties of the respective fluids. In still further examples, a non-aqueous vehicle can be used with an organic-soluble or organic-dispersible fusing agent.

In certain examples, a high boiling point co-solvent can be included in the fusing agent. The high boiling point co-solvent can be an organic co-solvent that boils at a temperature higher than the temperature of the powder bed during printing. In some examples, the high boiling point co-solvent can have a boiling point above about 250° C. In still further examples, the high boiling point co-solvent can be present in the fusing agent at a concentration from about 1 wt % to about 4 wt %.

Classes of co-solvents that can be used can include organic co-solvents including aliphatic alcohols, aromatic alcohols, diols, glycol ethers, polyglycol ethers, caprolactams, formamides, acetamides, and long chain alcohols. Examples of such compounds include 1-aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include, but are not limited to, 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanediol.

Regarding the surfactant that may be present, a surfactant or surfactants can be used, such as alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. The amount of surfactant added to the fusing agent may range from about 0.01 wt % to about 20 wt %. Suitable surfactants can include, but are not limited to, liponic esters such as Tergitol™ 15-S-12, Tergitol™ 15-S-7 available from Dow Chemical Company (Michigan), LEG-1 and LEG-7; Triton™ X-100; Triton™ X-405 available from Dow Chemical Company (Michigan); and sodium dodecylsulfate.

Various other additives can be employed to enhance certain properties of the fusing agent for specific applications. Examples of these additives are those added to inhibit the growth of harmful microorganisms. These additives may be biocides, fungicides, and other microbial agents, which can be used in various formulations. Examples of suitable microbial agents include, but are not limited to, NUOSEPT® (Nudex, Inc., New Jersey), UCARCIDE™ (Union carbide Corp., Texas), VANCIDE® (R.T. Vanderbilt Co., Connecticut), PROXEL® (ICI Americas, New Jersey), and combinations thereof.

Sequestering agents, such as EDTA (ethylene diamine tetra acetic acid), may be included to eliminate the deleterious effects of heavy metal impurities, and buffer solutions may be used to control the pH of the fluid. From about 0.01 wt % to about 2 wt %, for example, can be used. Viscosity modifiers and buffers may also be present, as well as other additives to modify properties of the fluid as desired. Such additives can be present at from about 0.01 wt % to about 20 wt %.

Detailing Agents

In further examples, multi-fluid kits or three-dimensional printing kits can include a detailing agent. The detailing agent can include a detailing compound. The detailing compound can be capable of reducing the temperature of the powder bed material onto which the detailing agent is applied. In some examples, the detailing agent can be printed around the edges of the portion of the powder that is printed with the fusing agent. The detailing agent can increase selectivity between the fused and unfused portions of the powder bed by reducing the temperature of the powder around the edges of the portion to be fused.

In some examples, the detailing compound can be a solvent that evaporates at the temperature of the powder bed. In some cases the powder bed can be preheated to a preheat temperature within about 10° C. to about 70° C. of the fusing temperature of the polymer powder. Depending on the type of polymer powder used, the preheat temperature can be in the range of about 90° C. to about 200° C. or more. The detailing compound can be a solvent that evaporates when it comes into contact with the powder bed at the preheat temperature, thereby cooling the printed portion of the powder bed through evaporative cooling. In certain examples, the detailing agent can include water, co-solvents, or combinations thereof. Non-limiting examples of co-solvents for use in the detailing agent can include xylene, methyl isobutyl ketone, 3-methoxy-3-methyl-1-butyl acetate, ethyl acetate, butyl acetate, propylene glycol monomethyl ether, ethylene glycol mono tert-butyl ether, dipropylene glycol methyl ether, diethylene glycol butyl ether, ethylene glycol monobutyl ether, 3-Methoxy-3-Methyl-1-butanol, isobutyl alcohol, 1,4-butanediol, N,N-dimethyl acetamide, and combinations thereof. In some examples, the detailing agent can be mostly water. In a particular example, the detailing agent can be about 85 wt % water or more. In further examples, the detailing agent can be about 95 wt % water or more. In still further examples, the detailing agent can be substantially devoid of radiation absorbers. That is, in some examples, the detailing agent can be substantially devoid of ingredients that absorb enough radiation energy to cause the powder to fuse. In certain examples, the detailing agent can include colorants such as dyes or pigments, but in small enough amounts that the colorants do not cause the powder printed with the detailing agent to fuse when exposed to the radiation energy.

The detailing agent can also include ingredients to allow the detailing agent to be jetted by a fluid jet printhead. In some examples, the detailing agent can include jettability imparting ingredients such as those in the fusing agent described above. These ingredients can include a liquid vehicle, surfactant, dispersant, co-solvent, biocides, viscosity modifiers, materials for pH adjustment, sequestering agents, preservatives, and so on. These ingredients can be included in any of the amounts described above.

Methods of Making 3D Printed Articles

Figure 4:
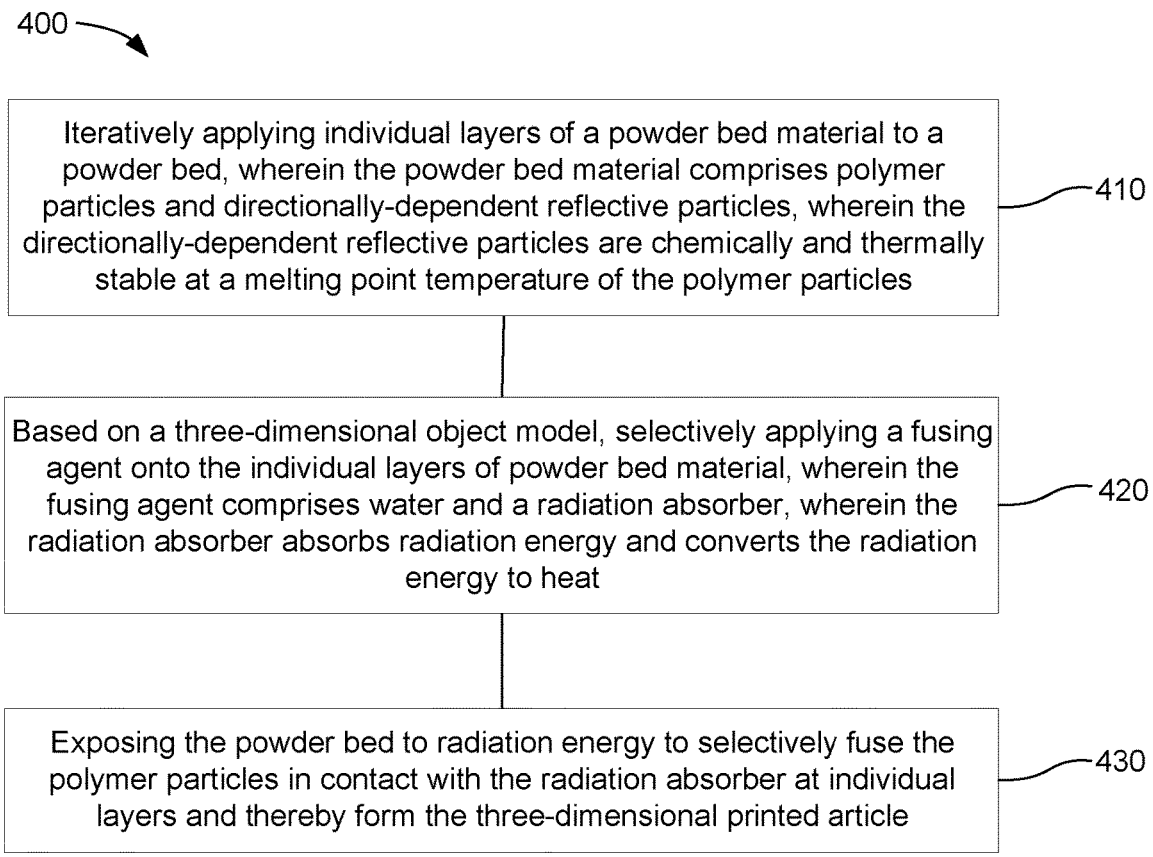
FIG. 4 is a flowchart illustrating an example method of making a three-dimensional printed article in accordance with examples of the present disclosure.

The present disclosure also describes methods of making three-dimensional printed articles. FIG. 4 shows a flowchart illustrating one example method 400 of making a three-dimensional printed article. The method includes: iteratively applying individual layers of a powder bed material to a powder bed, wherein the powder bed material includes polymer particles and directionally-dependent reflective particles, wherein the directionally-dependent reflective particles are chemically and thermally stable at a melting point temperature of the polymer particles 410; based on a three-dimensional object model, selectively jetting a fusing agent onto the individual layers of powder bed material, wherein the fusing agent includes water and a radiation absorber, wherein the radiation absorber absorbs radiation energy and converts the radiation energy to heat 420; and exposing the powder bed to radiation energy to selectively fuse the polymer particles in contact with the radiation absorber at individual layers and thereby form the three-dimensional printed article 430. The powder bed material and fusing agent can have any of the ingredients and properties described above.

In some examples, a detailing agent can also be jetted onto the powder bed. As described above, the detailing agent can be a fluid that reduces the maximum temperature of the polymer powder on which the detailing agent is printed. In particular, the maximum temperature reached by the powder during exposure to electromagnetic energy can be less in the areas where the detailing agent is applied. In certain examples, the detailing agent can include a solvent that evaporates from the polymer powder to evaporatively cool the polymer powder. The detailing agent can be printed in areas of the powder bed where fusing is not desired. In particular examples, the detailing agent can be printed along the edges of areas where the fusing agent is printed. This can give the fused layer a clean, defined edge where the fused polymer particles end and the adjacent polymer particles remain unfused. In other examples, the detailing agent can be printed in the same area where the fusing agent is printed to control the temperature of the area to be fused. In certain examples, some areas to be fused can tend to overheat, especially in central areas of large fused sections. To control the temperature and avoid overheating (which can lead to melting and slumping of the build material), the detailing agent can be applied to these areas The fusing agent and detailing agent can be jetted onto the powder bed using fluid jet print heads. The amount of the fusing agent used can be calibrated based the concentration of radiation absorber in the fusing agent, the level of fusing desired for the polymer particles, and other factors. In some examples, the amount of fusing agent printed can be sufficient to contact the radiation absorber with the entire layer of polymer powder. For example, if each layer of polymer powder is 100 microns thick, then the fusing agent can penetrate 100 microns into the polymer powder. Thus the fusing agent can heat the polymer powder throughout the entire layer so that the layer can coalesce and bond to the layer below. After forming a solid layer, a new layer of loose powder can be formed, either by lowering the powder bed or by raising the height of a powder roller and rolling a new layer of powder.

In some examples, the entire powder bed can be preheated to a temperature below the melting or softening point of the polymer powder. In one example, the preheat temperature can be from about 10° C. to about 30° C. below the melting or softening point. In another example, the preheat temperature can be within 50° C. of the melting of softening point. In a particular example, the preheat temperature can be from about 160° C. to about 170° C. and the polymer powder can be nylon 12 powder. In another example, the preheat temperature can be about 90° C. to about 100° C. and the polymer powder can be thermoplastic polyurethane. Preheating can be accomplished with a lamp or lamps, an oven, a heated support bed, or other types of heaters. In some examples, the entire powder bed can be heated to a substantially uniform temperature.

The powder bed can be irradiated with a fusing lamp. Suitable fusing lamps for use in the methods described herein can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing agent leaving the unprinted portions of the polymer powder below the melting or softening point.

In one example, the fusing lamp can be matched with the radiation absorber in the fusing agent so that the fusing lamp emits wavelengths of light that match the peak absorption wavelengths of the radiation absorber. A radiation absorber with a narrow peak at a particular near-infrared wavelength can be used with a fusing lamp that emits a narrow range of wavelengths at approximately the peak wavelength of the radiation absorber. Similarly, a radiation absorber that absorbs a broad range of near-infrared wavelengths can be used with a fusing lamp that emits a broad range of wavelengths. Matching the radiation absorber and the fusing lamp in this way can increase the efficiency of coalescing the polymer particles with the fusing agent printed thereon, while the unprinted polymer particles do not absorb as much light and remain at a lower temperature.

Depending on the amount of radiation absorber present in the polymer powder, the absorbance of the radiation absorber, the preheat temperature, and the melting or softening point of the polymer, an appropriate amount of irradiation can be supplied from the fusing lamp. In some examples, the fusing lamp can irradiate each layer from about 0.5 to about 10 seconds per pass.

The 3D printed article can be formed by jetting a fusing agent onto layers of powder bed build material according to a 3D object model. 3D object models can in some examples be created using computer aided design (CAD) software. 3D object models can be stored in any suitable file format. In some examples, a 3D printed article as described herein can be based on a single 3D object model. In certain examples, the 3D object model can define the three-dimensional shape of the article and the three-dimensional shape of areas of the powder bed to be jetted with detailing agent. In other examples, the article can be defined by a first 3D object model a second 3D object model can define areas to jet the detailing agent. In further examples, the jetting of the detailing agent may not be controlled using a 3D object model, but using some other parameters or instructions to the 3D printing system. Other information may also be included in 3D object models, such as structures to be formed of additional different materials or color data for printing the article with various colors at different locations on the article. The 3D object model may also include features or materials specifically related to jetting fluids on layers of powder bed material, such as the desired amount of fluid to be applied to a given area. This information may be in the form of a droplet saturation, for example, which can instruct a 3D printing system to jet a certain number of droplets of fluid into a specific area. This can allow the 3D printing system to finely control radiation absorption, cooling, color saturation, and so on. All this information can be contained in a single 3D object file or a combination of multiple files. The 3D printed article can be made based on the 3D object model. As used herein, "based on the 3D object model" can refer to printing using a single 3D object model file or a combination of multiple 3D object models that together define the article. In certain examples, software can be used to convert a 3D object model to instructions for a 3D printer to form the article by building up individual layers of build material.

In an example of the 3D printing process, a thin layer of polymer powder can be spread on a bed to form a powder bed. At the beginning of the process, the powder bed can be empty because no polymer particles have been spread at that point. For the first layer, the polymer particles can be spread onto an empty build platform. The build platform can be a flat surface made of a material sufficient to withstand the heating conditions of the 3D printing process, such as a metal. Thus, "applying individual build material layers of polymer particles to a powder bed" includes spreading polymer particles onto the empty build platform for the first layer. In other examples, a number of initial layers of polymer powder can be spread before the printing begins. These "blank" layers of powder bed material can in some examples number from about 10 to about 500, from about 10 to about 200, or from about 10 to about 100. In some cases, spreading multiple layers of powder before beginning the print can increase temperature uniformity of the 3D printed article. A fluid jet printing head, such as an inkjet print head, can then be used to print a fusing agent including a radiation absorber over portions of the powder bed corresponding to a thin layer of the 3D article to be formed. Then the bed can be exposed to electromagnetic energy, e.g., typically the entire bed. The electromagnetic energy can include light, infrared radiation, and so on. The radiation absorber can absorb more energy from the electromagnetic energy than the unprinted powder. The absorbed light energy can be converted to thermal energy, causing the printed portions of the powder to soften and fuse together into a formed layer. After the first layer is formed, a new thin layer of polymer powder can be spread over the powder bed and the process can be repeated to form additional layers until a complete 3D article is printed. Thus, "applying individual build material layers of polymer particles to a powder bed" also includes spreading layers of polymer particles over the loose particles and fused layers beneath the new layer of polymer particles.

Systems for Three-Dimensional Printing

Figure 5:
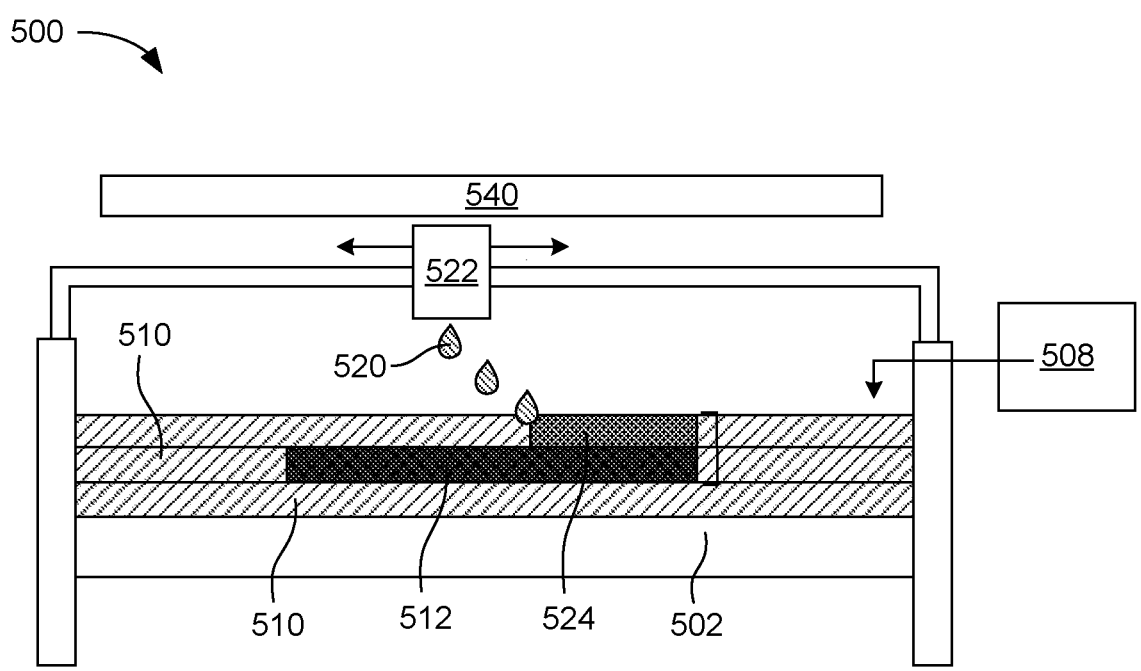
FIG. 5 is a schematic view of an example system for three-dimensional printing in accordance with examples of the present disclosure.

The present disclosure also extends to systems for three-dimensional printing. The systems can generally include the powder bed material and the fusing agent described above. The systems can also include a radiant energy source positioned to expose the powder bed material to radiation to selectively fuse the polymer particles in contact with the radiation absorber from the fusing agent. In some examples, the powder bed material can be distributed in individual layers by a build material applicator, and the fusing agent can be jetted onto the layers by a fluid ejector. FIG. 5 shows an example system 500 for three-dimensional printing in accordance with the present disclosure. The system includes a build platform 502. Powder bed material 510 can be deposited onto the build platform by a build material applicator 508 where the powder bed material can be flattened or smoothed, such as by a mechanical roller or other flattening technique. This can form a flat layer of powder bed material. The fusing agent 520 can then be applied to the layer by a fluid ejector 522. The area 524 where the fusing agent is applied can correspond to a layer or slice of a 3D object model. The system can include a radiant energy source 540 that can apply heat to the layers of powder bed material and fusing agent that has been applied. In this particular example, the system includes a radiant energy source that can irradiate the entire powder bed at once instead of a moveable radiant energy source that moves across the powder bed. The radiant energy source can heat the powder bed material and fusing agent until the powder bed material on which the fusing agent was printed reaches a melting or softening point temperature of the powder bed material. The polymer particles can fuse together to form a solid polymer matrix 512. In this figure, one layer of solid polymer matrix has already been formed and then a layer of additional powder bed material has been spread over the top of the solid layer. The figure shows the fusing agent being applied to the additional layer, which can then subsequently bed heated and fused to add another solid layer to the three-dimensional printed article.

As used herein, "applying individual build material layers of polymer particles to a powder bed" can include applying the first layer of powder bed material that is applied directly to an empty support bed. The "support bed" can refer to the build platform, as shown in FIG. 5, for example. Additionally, in some examples, a layer or multiple layers of powder bed material can be laid on the support bed without jetting any fusing agent onto the layers. This can provide a more thermally uniform temperature profile for the first layer to have the fusing agent jetted thereon. Accordingly, "applying individual build material layers of polymer particles to a powder bed" can include applying a layer of powder bed material onto the initial layer or layers that may be applied without any fusing agent. The phrase "applying individual build material layers of polymer particles to a powder bed" also includes applying to subsequent layers, when a layer or slice of the three-dimensional printed article has already been formed in the layer below.

In further examples, the system can include a radiant energy source. The radiant energy source can be positioned above the powder bed material as in FIG. 5, or in other examples the heater can be on a side or sides of the powder bed material, or a combination of these locations. In some examples, the support bed can include an additional integrated heater to heat the powder bed material from below to maintain a more uniform temperature in the powder bed. The radiant energy source can be used to heat the areas of the powder bed where fusing agent has been applied to fuse the polymer particles in those areas. In certain examples, the radiant energy source heater can include a heat lamp, infrared heater, halogen lamp, fluorescent lamp, or other type of radiant energy source. In further examples, the radiant energy source can be mounted on a carriage to move across the powder bed. In certain examples, the fusing agent ejector and the radiant energy source can both be mounted on a carriage to move across the powder bed. For example, the fusing agent can be jetted from the fusing agent ejector on a forward pass of the carriage, and the radiant energy source can be activated to irradiate the powder bed on a return pass of the carriage. A detailing agent ejector and any other fluid ejectors in the system can also be mounted on the carriage.

Definitions

It is noted that, as used in this specification and the appended claims, the singular forms "a," "an," and "the" include plural referents unless the context clearly dictates otherwise.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe pigment colorants, and also other pigments such as organometallics, ferrites, ceramics, etc. In one specific aspect, however, the pigment is a pigment colorant.

As used herein, "applying" when referring to fusing agent and/or detailing, for example, refers to any technology that can be used to put or place the respective fluid agent on or into a layer of powder bed material for forming 3D articles. For example, "applying" may refer to "jetting," "ejecting," "dropping," "spraying," or the like.

As used herein, "jetting" or "ejecting" refers to fluid agents or other compositions that are expelled from ejection or jetting architecture, such as ink-jet architecture. Ink-jet architecture can include thermal or piezoelectric architecture, for example. Additionally, such architecture can be configured to print varying drop sizes such as from about 3 picoliters to less than about 10 picoliters, or to less than about 20 picoliters, or to less than about 30 picoliters, or to less than about 50 picoliters, etc.

As used herein, "average particle size" refers to a number average of the diameter of the particles for spherical particles, or a number average of the volume equivalent sphere diameter for non-spherical particles. The volume equivalent sphere diameter is the diameter of a sphere having the same volume as the particle. Average particle size can be measured using a particle analyzer such as the Mastersizer™

3000 available from Malvern Panalytical. The particle analyzer can measure particle size using laser diffraction. A laser beam can pass through a sample of particles and the angular variation in intensity of light scattered by the particles can be measured. Larger particles scatter light at smaller angles, while small particles scatter light at larger angles. The particle analyzer can then analyze the angular scattering data to calculate the size of the particles using the Mie theory of light scattering. The particle size can be reported as a volume equivalent sphere diameter.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context. When using the term "substantial" or "substantially" in the negative, e.g., substantially devoid of a material, what is meant is from none of that material is present, or at most, trace amounts could be present at a concentration that would not impact the function or properties of the composition as a whole.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include the numerical values explicitly recited as the limits of the range, and also to include individual numerical values or sub-ranges encompassed within that range as if each numerical value and sub-range is explicitly recited. As an illustration, a numerical range of "about 1 wt % to about 5 wt %" should be interpreted to include the explicitly recited values of about 1 wt % to about 5 wt %, and also to include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting a single numerical value. Furthermore, such an interpretation should apply regardless of the breadth of the range or the characteristics being described.

EXAMPLES

The following illustrates examples of the present disclosure. However, it is to be understood that the following are merely illustrative of the application of the principles of the present disclosure. Numerous modifications and alternative devices, methods, and systems may be devised without departing from the spirit and scope of the present disclosure. The appended claims are intended to cover such modifications and arrangements.

Example 1

3D printed articles were made using directionally-dependent reflective particles. The 3D printed articles were made using a thermoplastic polyamide (TPA) formulation having a melting temperature ($T_m$) of 155° C. For the TPA formulation, a polymer powder made of TPA particles was dry blended with solvent-resistant micronized PET-based iridescent additive (MPIA). The amount of MPIA was 7.5 wt % with respect to the total weight of the blended powder. The 7.5 wt % MPIA included 2-4% of ultrafine MPIA (200 μm in size) and 2-4% macroscopic MPIA (on the order of a few millimeters). These powders were used as the powder bed material in an HP Multi Jet Fusion (MJF) 3D™ test printer. A fusing agent that included a carbon black pigment as a radiation absorber was jetted onto the powder bed to fuse the TPA particles. The same print mode parameters were used for printing each article, which were the normal print mode parameters used with that particular test printer. The incorporation of the MPIA in the 3D printed articles appeared to be both randomly and uniformly distributed throughout each of the 3D printed articles. The 3D printed articles were printed without any observable or visual difference to 3D printed articles that were made without directionally-dependent reflective particles, besides the light reflectance caused by the directionally-dependent reflective particles. This indicates that the directionally-dependent reflective particles can be successfully used in the powder bed material without changing the print mode. The 3D printed articles were similar in appearance and seemed to have equivalent print quality and strength. Further, despite the harsh thermosoxidative nature of MJF, the MPIAs used appeared to retain the desired properties after prototype printing. The 3D printed articles included standard type 5 dogbones, and a complex star to show that incorporation of MPIAs could also be achieved on non-flat surfaces.

Example 2

The experiment was repeated using a multipurpose polyamide 12 (MP PA-12) formulation having a $T_m$ of 180° C. Again, for the MP PA-12 formulation, a polymer made of MP PA-12 particles was dry blended with the MPIA. The amount of MPIA was 7.5 wt % with respect to the total weight of the blended powder. The 7.5 wt % MPIA included 2-4% of ultrafine MPIA (200 μm in size) and 2-4% macroscopic MPIA (on the order of a few millimeters). These powders were used as the powder bed material in an HP Multi Jet Fusion (MJF) 3D test printer. Again, the 3D printed articles were similar in appearance and seemed to have equivalent print quality and strength. The 3D printed articles included a badge holder.

Further, a same sparkling finish could not be obtained via injection molding of the same MP PA-12 powder formulation. The higher peak temperature (235° C.) and high pressure (700 bar) needed for successful injection molding results in harsh conditions that simultaneously embed and degrade the PET additive into the part. Combined with the increased rapid cooling (e.g., faster crystallization) that comes with an injection molding process relative to MJF and the inorganic pigment additive found in MP PA-12, the resulting opacity of the part is also increased. In addition, the layer-by-layer nature of MJF enables the ability to generate 3D parts with sparkling surface finishes in a more reliable manner than with injection molding of the same powder material.

What is claimed is:

1. A three-dimensional printing kit, comprising:
   a powder bed material comprising polymer-consisting particles mixed with directionally-dependent reflective particles, wherein the directionally-dependent reflective particles include polyethylene terephthalate (PET) particles having a reflective coating and having an X dimension length, a Y dimension width, and a Z dimension thickness that is no more than 10% of each of the X dimension length and the Y dimension width, and wherein the directionally-dependent reflective particles are chemically and thermally stable at a melting point temperature of the polymer-consisting particles; and
   a fusing agent to selectively apply to the powder bed material, wherein the fusing agent comprises water and a radiation absorber to absorb radiation energy and convert the radiation energy to heat.

2. The three-dimensional printing kit of claim 1, wherein the reflective coating has a melting point temperature from about 10° C. to about 100° C. greater than a melting point temperature of the polymer-consisting particles.

3. The three-dimensional printing kit of claim 1, wherein the X dimension length is from about 200 μm to about 2 mm and the Y dimension width is from about 200 μm to about 2 mm.

4. The three-dimensional printing kit of claim 1, wherein the polymer-consisting particles are present in the powder bed material in an amount ranging from about 60 wt % to about 99 wt %, based on the total weight of the powder bed material.

5. The three-dimensional printing kit of claim 1, wherein the directionally-dependent reflective particles are present in the powder bed material in an amount ranging from about 0.05 wt % to about 30 wt %, based on the total weight of the powder bed material.

6. The three-dimensional printing kit of claim 1, wherein a melting point temperature of the polymer-consisting particles is from about 70° C. to about 350° C.

7. The three-dimensional printing kit of claim 1, wherein the radiation absorber is selected from the group consisting of a metal dithiolene complex, carbon black, a near-infrared absorbing dye, a near-infrared absorbing pigment, metal nanoparticles, a conjugated polymer, and a combination thereof.

8. The three-dimensional printing kit of claim 1, wherein the polymer-consisting particles are selected from the group consisting of polyamide 6 particles, polyamide 9 particles, polyamide 11 particles, multipurpose polyamide 12 (MP PA-12) particles, polyamide 66 particles, polyamide 612 particles, thermoplastic polyamide (TPA) particles, polyamide copolymer particles, polyethylene particles, thermoplastic polyurethane particles, polypropylene particles, polyester particles, polycarbonate particles, polyether ketone particles, polyacrylate particles, polystyrene particles, wax particles, and a combination thereof.

9. The three-dimensional printing kit of claim 1, further comprising a detailing agent comprising a detailing compound, wherein the detailing compound reduces a temperature of powder bed material onto which the detailing agent is applied.

10. A method of making a three-dimensional printed article, comprising:
   iteratively applying individual layers of a powder bed material to a powder bed, wherein the powder bed material comprises polymer-consisting particles mixed with directionally-dependent reflective particles, wherein the directionally-dependent reflective particles include polyethylene terephthalate (PET) particles having a reflective coating and having an X dimension length, a Y dimension width, and a Z dimension thickness that is no more than 10% of each of the X dimension length and the Y dimension width, and wherein the directionally-dependent reflective particles are chemically and thermally stable at a melting point temperature of the polymer-consisting particles;
   based on a three-dimensional object model, selectively applying a fusing agent onto the individual layers of powder bed material, wherein the fusing agent comprises water and a radiation absorber, wherein the radiation absorber absorbs radiation energy and converts the radiation energy to heat; and
   exposing the powder bed to radiation energy to selectively fuse the polymer-consisting particles in contact with the radiation absorber at individual layers and thereby form the three-dimensional printed article.

11. The method of claim 10, further comprising forming the powder bed material by mixing the directionally-dependent reflective particles with the polymer-consisting particles.

12. The three-dimensional printing kit of claim 1, wherein the directionally-dependent reflective particles are present in the powder bed material in an amount of from about 0.05 wt % to about 30 wt %.

13. A three-dimensional printing kit, comprising:
   a powder bed material comprising polymer particles and directionally-dependent reflective particles, wherein the directionally-dependent reflective particles are chemically and thermally stable at a melting point temperature of the polymer particles, include polyethylene terephthalate (PET) particles having a reflective coating, and are present in the powder bed material in an amount of from about 0.05 wt % to about 30 wt %; and
   a fusing agent to selectively apply to the powder bed material, wherein the fusing agent comprises water and a radiation absorber to absorb radiation energy and convert the radiation energy to heat.

* * * * *